(12) United States Patent
Mizutani

(10) Patent No.: US 9,594,244 B2
(45) Date of Patent: Mar. 14, 2017

(54) LIGHT DEFLECTOR WITH PLATE-LIKE MIRROR FORMING A BASE OF A RECESS IN A MOVABLE MEMBER AND A MASS BODY ON A NON-DEFLECTING SURFACE OF THE MIRROR TO ADJUST A RESONENT FREQUENCY OF THE MOVABLE MEMBER

(71) Applicant: KYOCERA Document Solutions Inc., Osaka-shi, Osaka (JP)

(72) Inventor: Hideji Mizutani, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 27 days.

(21) Appl. No.: 14/289,807

(22) Filed: May 29, 2014

(65) Prior Publication Data
US 2014/0355090 A1    Dec. 4, 2014

(30) Foreign Application Priority Data

May 31, 2013    (JP) ................................. 2013-115463

(51) Int. Cl.
| | | |
|---|---|---|
| *G02B 26/10* | (2006.01) | |
| *B81B 3/00* | (2006.01) | |
| *G02B 26/08* | (2006.01) | |

(52) U.S. Cl.
CPC .......... *G02B 26/105* (2013.01); *B81B 3/0045* (2013.01); *G02B 26/0858* (2013.01);
(Continued)

(58) Field of Classification Search
CPC .. G02B 26/10; G02B 26/105; G02B 27/0031; G02B 26/124; G02B 26/0858;
(Continued)

(56) References Cited

U.S. PATENT DOCUMENTS

| | | | | |
|---|---|---|---|---|
| 6,870,235 B2* | 3/2005 | Abstreiter | .......... | G01N 27/4145 257/17 |
| 6,894,823 B2* | 5/2005 | Taylor | .................. | G02B 26/085 359/200.7 |
| 7,482,730 B2* | 1/2009 | Davis | ................. | G02B 26/0833 310/311 |
| 2003/0175530 A1* | 9/2003 | Ko | .......................... | B81C 3/001 428/432 |
| 2004/0070816 A1* | 4/2004 | Kato | .................... | G02B 26/085 359/291 |
| 2005/0179951 A1* | 8/2005 | Urakawa | ............ | G02B 26/0833 358/3.08 |

(Continued)

FOREIGN PATENT DOCUMENTS

| | | |
|---|---|---|
| JP | H07-092409 | 4/1995 |
| JP | 2006-071678 | 3/2003 |

(Continued)

OTHER PUBLICATIONS

Japanese Patent Appl. No. 2013-115463—Office Action issued Jul. 28, 2015.

*Primary Examiner* — Bumsuk Won
*Assistant Examiner* — Henry Duong
(74) *Attorney, Agent, or Firm* — Gerald E. Hespos; Michael J. Porco; Matthew T. Hespos

(57) ABSTRACT

A light deflector includes a fixing portion and a movable portion. The movable portion includes a mirror portion for deflecting light by swinging about a predetermined swing axis, a torsion bar fixedly supported on the fixing portion and having an axis serving as the swing axis, and a supporting body configured to support the mirror portion and fixed to the torsion bar. The supporting body includes a hole portion through which the axis passes. A mass body for adjusting a resonant frequency of the movable portion is arranged in the hole portion.

18 Claims, 14 Drawing Sheets

(52) U.S. Cl.
CPC . *B81B 2201/042* (2013.01); *B81B 2203/0109* (2013.01); *B81B 2203/0154* (2013.01)

(58) Field of Classification Search
CPC .... G02B 26/12; G02B 26/127; G02B 26/121; G02B 7/1821; G02B 26/101; G02B 26/0833; G02B 26/0841; G02B 6/3518; G02B 26/085; G02B 6/2931; G02B 27/141; G02B 6/3516; G02B 26/0808; G02B 26/125; G02B 26/0866; G02B 26/0816; G02B 6/3512; G02B 6/3556; G02B 6/357; G02B 6/3584; H04N 1/1135; B81B 3/0045; B81B 2203/0109; B81B 2201/042; B81B 2203/0154; B81B 2201/045; B81B 2203/058; B81B 3/007; B81B 3/0051; B81B 2203/053; B81B 2201/033; G02C 5/2209; G02C 5/22; G02C 5/2254; G02C 5/008; G02C 5/10; H02K 33/16; G01N 21/0303; G01N 21/031; G01S 7/4811; G01S 7/4813; G01S 7/4817; B81C 1/00357; B81C 2201/019; B60R 1/025; B23K 26/0807
USPC ......... 359/196.1, 197.1, 198.1, 199.1, 199.2, 359/199.3, 199.4, 200.2, 200.6, 200.7, 359/200.8, 212.1, 212.2, 213.1, 214.1, 359/221.2, 223.1, 224.1, 226.2

See application file for complete search history.

(56) References Cited

U.S. PATENT DOCUMENTS

| | | | |
|---|---|---|---|
| 2007/0064293 | A1* | 3/2007 | Turner ................. G02B 26/085 359/224.1 |
| 2007/0291343 | A1 | 12/2007 | Kato et al. |
| 2008/0122798 | A1 | 5/2008 | Koshiyama et al. |
| 2010/0195180 | A1* | 8/2010 | Akanuma .......... G02B 26/0858 359/200.8 |
| 2012/0133242 | A1 | 5/2012 | Njikam Njimonzie et al. |
| 2012/0162739 | A1 | 6/2012 | Yamada |
| 2012/0257235 | A1* | 10/2012 | Hino .................... G02B 26/085 358/1.13 |
| 2013/0070167 | A1 | 3/2013 | Tagami et al. |
| 2014/0139898 | A1 | 5/2014 | Yamada |

FOREIGN PATENT DOCUMENTS

| | | |
|---|---|---|
| JP | 2006-239842 | 9/2006 |
| JP | 2010-054944 | 3/2010 |
| JP | 2010-128116 | 6/2010 |
| JP | 2011-215354 | 10/2011 |
| JP | 2012-032678 | 2/2012 |
| JP | 2012-083436 | 4/2012 |
| JP | 2012-133242 | 7/2012 |
| JP | 2012-242595 | 12/2012 |
| WO | 2011/152215 | 12/2011 |

* cited by examiner

US 9,594,244 B2

LIGHT DEFLECTOR WITH PLATE-LIKE MIRROR FORMING A BASE OF A RECESS IN A MOVABLE MEMBER AND A MASS BODY ON A NON-DEFLECTING SURFACE OF THE MIRROR TO ADJUST A RESONENT FREQUENCY OF THE MOVABLE MEMBER

This application is based on Japanese Patent Application No. 2013-115463 filed with the Japan Patent Office on May 31, 2013, the contents of which are hereby incorporated by reference.

BACKGROUND

The present disclosure relates to a light deflector used in forming an electrostatic latent image and the like, a light deflector manufacturing method and an optical scanning device with such a light deflector.

In an electrophotographic image forming apparatus, a light beam modulated in accordance with image data is generated, reflected and deflected, whereby an image bearing member such as a photoconductive drum is scanned with the deflected light beam to form an electrostatic latent image. The light deflector is a device for reflecting and deflecting a light beam. A technique using MEMS (Micro Electro Mechanical Systems) mirrors as a light deflector instead of a polygon mirror has been proposed. The MEMS mirrors have an advantage of speeded-up scanning, low power consumption and the like.

The light deflector using the MEMS mirrors includes a torsion bar, mirror portions swingable about an axis of the torsion bar and mirror drivers.

Upon the input of drive signals to the mirror drivers, the mirror drivers resonate (vibrate) movable portions of the MEMS mirrors to swing the mirror portions about the axis of the torsion bar and, in this state, a light beam incident on the mirror portions is reflected and deflected to scan the light beam. The movable portion of the MEMS mirror is, in other words, a vibration system of the MEMS mirror and configured by the mirror portion and the torsion bar.

In the case of using the MEMS mirrors by setting the frequencies of the drive signals to be input to the MEMS mirrors at the same value for each MEMS mirror, a resonant frequency of the movable portion of the MEMS mirror (hereinafter, merely referred to as a resonance frequency in some cases) needs to be adjusted for each MEMS mirror. This is because a maximum deflection angle of the mirror portion differs for each MEMS mirror if the resonant frequency differs.

The resonant frequency is determined by a moment of inertia of the mirror portion, a spring constant of the torsion bar and the like. The resonant frequency changes if these physical quantities only slightly differ. For example, dimensions of the mirror portion affect the moment of inertia of the mirror portion, and the resonant frequency changes if the dimensions of the mirror portion differ from design values by several microns. Since errors in the above physical quantities unavoidably occur in the manufacturing of the MEMS mirror, the resonant frequency needs to be adjusted.

There have been proposed a technique for adjusting a resonant frequency by reducing a mass of a movable portion of a MEMS mirror and a technique for adjusting a resonant frequency by increasing a mass of a movable portion of the MEMS mirror.

The former technique adjusts the resonant frequency by providing a first area and a second area, which are symmetrical with respect to a torsion bar, forming a plurality of mass bodies in advance in the respective areas, selectively cutting off the mass body by a laser beam to reduce the mass of the movable portion of the MEMS mirror.

The latter technique adjusts the resonant frequency by making the mirror portion larger toward both left and right sides, providing a first area and a second area symmetrical with respect to a torsion bar, depositing and curing a liquid in each area to selectively form a mass body and increase the mass of the movable portion of the MEMS mirror.

SUMMARY

A light deflector according to a first aspect of the present disclosure includes a fixing portion and a movable portion. The movable portion includes a mirror portion for deflecting light by swinging about a predetermined swing axis, a torsion bar fixedly supported on the fixing portion and having an axis serving as the swing axis, and a supporting body configured to support the mirror portion and fixed to the torsion bar. The supporting body includes a hole portion through which the axis passes. A mass body for adjusting a resonant frequency of the movable portion is arranged in the hole portion.

A light deflector manufacturing method according to a second aspect of the present disclosure includes a first step, a second step and a third step. In the first step, the mirror portion is swung by inputting a drive signal to the light deflector in a state where the mass body is not arranged in the hole portion. In the second step, the mass body is supplied in a fluid state to the hole portion during the execution of the first step. In the third step, the supply of the mass body is stopped when the resonant frequency of the movable portion reaches a predetermined value during the execution of the second step.

An optical scanning device according to a third aspect of the present disclosure includes the above light deflector and a light source for irradiating a light beam to the mirror portion.

These and other objects, features and advantages of the present disclosure will become more apparent upon reading the following detailed description along with the accompanying drawings.

DETAILED DESCRIPTION

Figure 1:
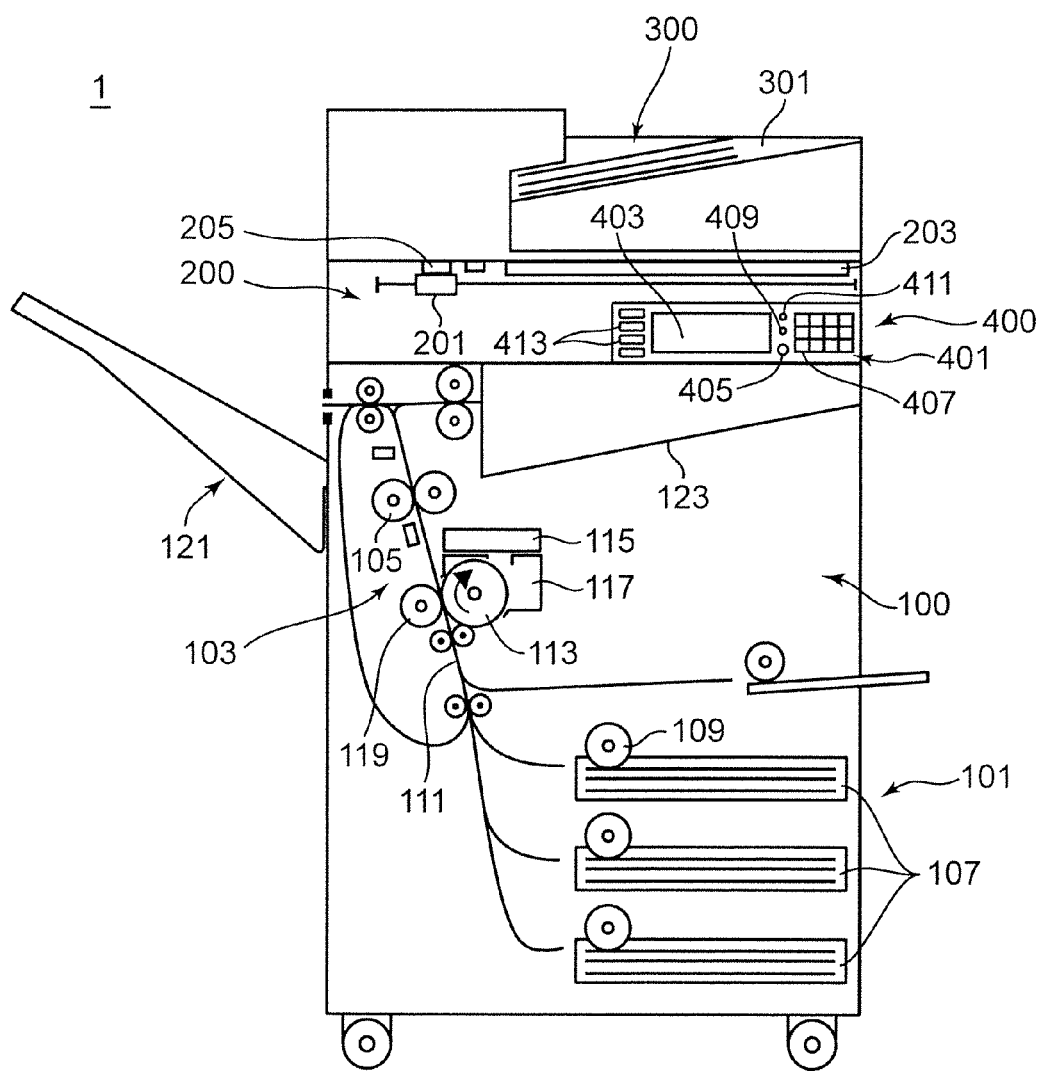
FIG. 1 is a diagram schematically showing an internal structure of an image forming apparatus to which a light deflector according to an embodiment is applied.

Hereinafter, an embodiment of the present disclosure is described based on the drawings. FIG. 1 is a diagram schematically showing an internal structure of an image forming apparatus 1 to which a light deflector according to the embodiment is applied. The image forming apparatus 1 can be, for example, applied to a digital complex machine having copier, printer, scanner and facsimile functions. The image forming apparatus 1 includes an apparatus main body 100, a document reading unit 200 arranged atop the apparatus main body 100, a document feeding unit 300 arranged atop the document reading unit 200 and an operation unit 400 arranged on the front surface of an upper part of the apparatus main body 100.

The document feeding unit 300 functions as an automatic document feeder and can successively feed a plurality of documents placed on a document placing portion 301 to the document reading unit 200.

The document reading unit 200 includes a carriage 201 carrying an exposure lamp and the like, a document platen 203 made of a transparent material such as glass, an unillustrated CCD (Charge Coupled Device) sensor and a document reading slit 205. In the case of reading a document placed on the document platen 203, the document is read by the CCD sensor while the carriage 201 is moved in a longitudinal direction of the document platen 203. Contrary to this, in the case of reading a document fed from the document feeding unit 300, the carriage 201 is moved to a position facing the document reading slit 205 and the document fed from the document feeding unit 300 is read by the CCD sensor through the document reading slit 205. The CCD sensor outputs an image of the read document as image data.

The apparatus main body 100 includes a sheet storing unit 101, an image forming unit 103 and a fixing unit 105. The sheet storing unit 101 is arranged in a lowest part of the apparatus main body 100 and includes sheet cassettes 107 capable of storing a stack of sheets. The uppermost sheet of the stack of sheets stored in the sheet cassette 107 is fed to a sheet conveyance path 111 by driving a pickup roller 109. The sheet is conveyed to the image forming unit 103 through the sheet conveyance path 111.

The image forming unit 103 forms a toner image on a sheet conveyed thereto. The image forming unit 103 includes a photoconductive drum 113, an optical scanning device 115, a developing unit 117 and a transfer unit 119. The optical scanning device 115 generates light modulated in accordance with image data (image data output from the document reading unit 200, image data transmitted from a personal computer, facsimile-received image data or the like) and irradiates the light to the peripheral surface of the uniformly charged photoconductive drum 113. This causes an electrostatic latent image corresponding to the image data to be formed on the peripheral surface of the photoconductive drum 113. In this state, toner is supplied from the developing unit 117 to the peripheral surface of the photoconductive drum 113, whereby a toner image corresponding to the image data is formed on the peripheral surface. This toner image is transferred to a sheet conveyed from the sheet storing unit 101 described above by the transfer unit 119.

The sheet having the toner image transferred thereto is conveyed to the fixing unit 105. In the fixing unit 105, heat and pressure are applied to the toner image and the sheet to fix the toner image to the sheet. The sheet is discharged to a stack tray 121 or a sheet discharge tray 123.

The operation unit 400 includes an operation key unit 401 and a display unit 403. The display unit 403 has a touch panel function and displays a screen including soft keys. A user makes settings necessary to perform a function such as a copy function by operating the soft keys while viewing the screen.

The operation key unit 401 includes operation keys which are hard keys, specifically a start key 405, a numerical keypad 407, a stop key 409, a reset key 411, function changeover keys 413 for switching the function among copier, printer, scanner and facsimile functions and the like.

The start key 405 is a key for starting an operation such as copying or facsimile transmission. The numerical keypad 407 is a keypad for entering numbers such as the number of copies and facsimile numbers. The stop key 409 is a key for stopping a copying operation and the like on the way. The reset key 411 is a key for returning the set content to an initial setting state.

The function changeover keys 413 are keys including a copy key, a transmit key and the like and configured to switch a copy function, a transmit function and the like from one to another. If the copy key is operated, an initial screen for copying is displayed on the display unit 403. If the transmit key is operated, an initial screen for facsimile transmission and mail transmission is displayed on the display unit 403.

Figure 2:
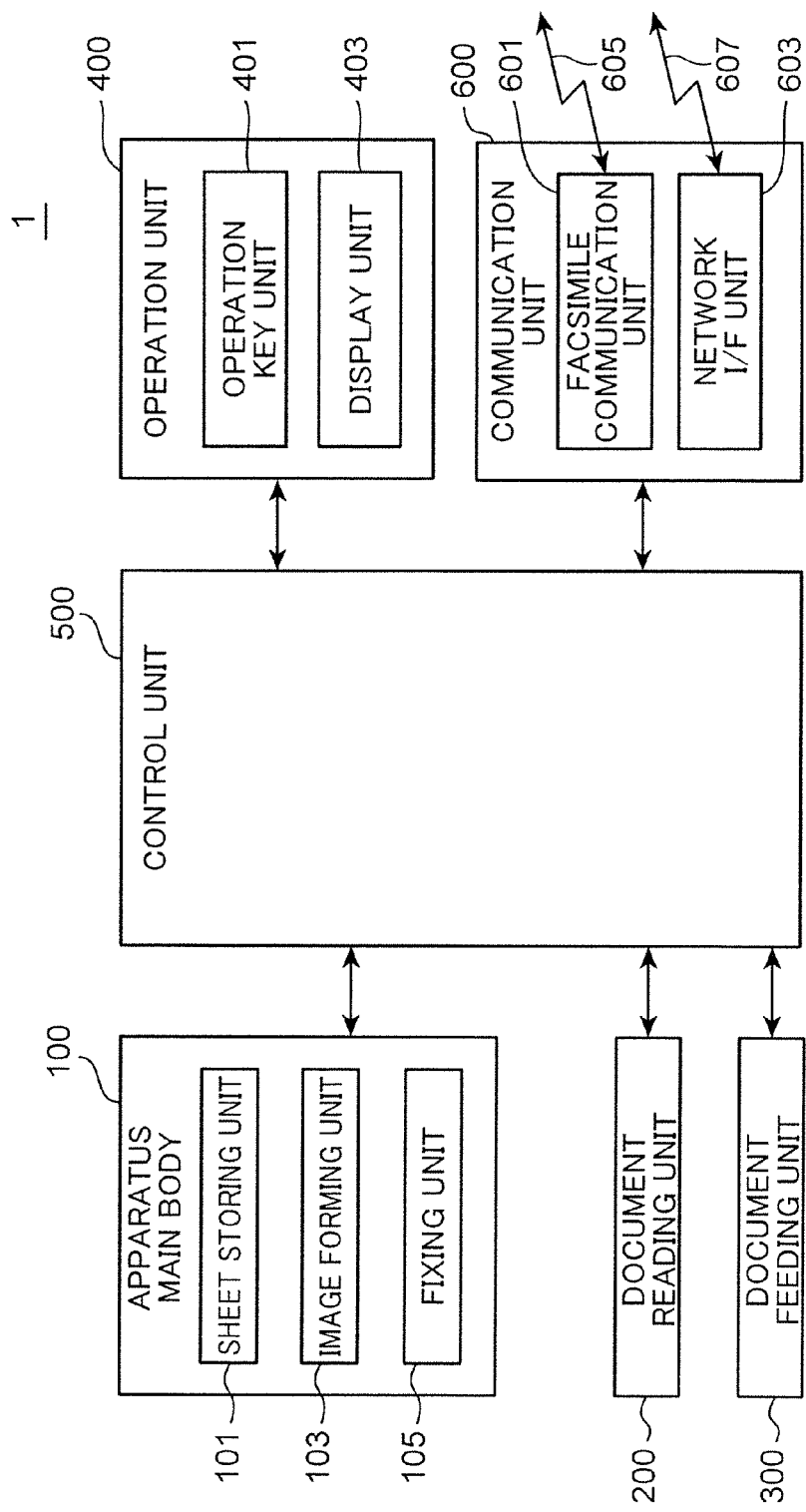
FIG. 2 is a block diagram showing the configuration of the image forming apparatus shown in FIG. 1.

FIG. 2 is a block diagram showing the configuration of the image forming apparatus 1 shown in FIG. 1. The image forming apparatus 1 is so configured that the document reading unit 200, the document feeding unit 300, the operation unit 400, a control unit 500 and a communication unit 600 are connected to each other by a bus. The apparatus main body 100, the document reading unit 200, the document feeding unit 300 and the operation unit 400 are not described since being already described.

The control unit 500 includes a CPU (Central Processing Unit), a ROM (Read Only Memory), a RAM (Random Access Memory), an image memory and the like. The CPU executes a control necessary to operate the image forming apparatus 1 on the above constituent elements of the image forming apparatus 1 such as the apparatus main body 100.

The ROM stores software necessary to control the operation of the image forming apparatus 1. The RAM is used such as to temporarily store data generated during the execution of the software and store application software. The image memory temporarily stores image data (image data output from the document reading unit 200, image data transmitted from a personal computer, facsimile-received image data or the like).

The communication unit 600 includes a facsimile communication unit 601 and a network I/F unit 603. The facsimile communication unit 601 includes an NCU (Network Control Unit) for controlling a telephone line connection with a destination facsimile machine and a modulation/demodulation circuit for modulating/demodulating a signal for facsimile communication. The facsimile communication unit 601 is connected to a telephone line 605.

The network I/F unit 603 is connected to a LAN (Local Area Network) 607. The network I/F unit 603 is a communication interface circuit for carrying out communication with terminal units such as personal computers connected to the LAN 607.

Figure 3:
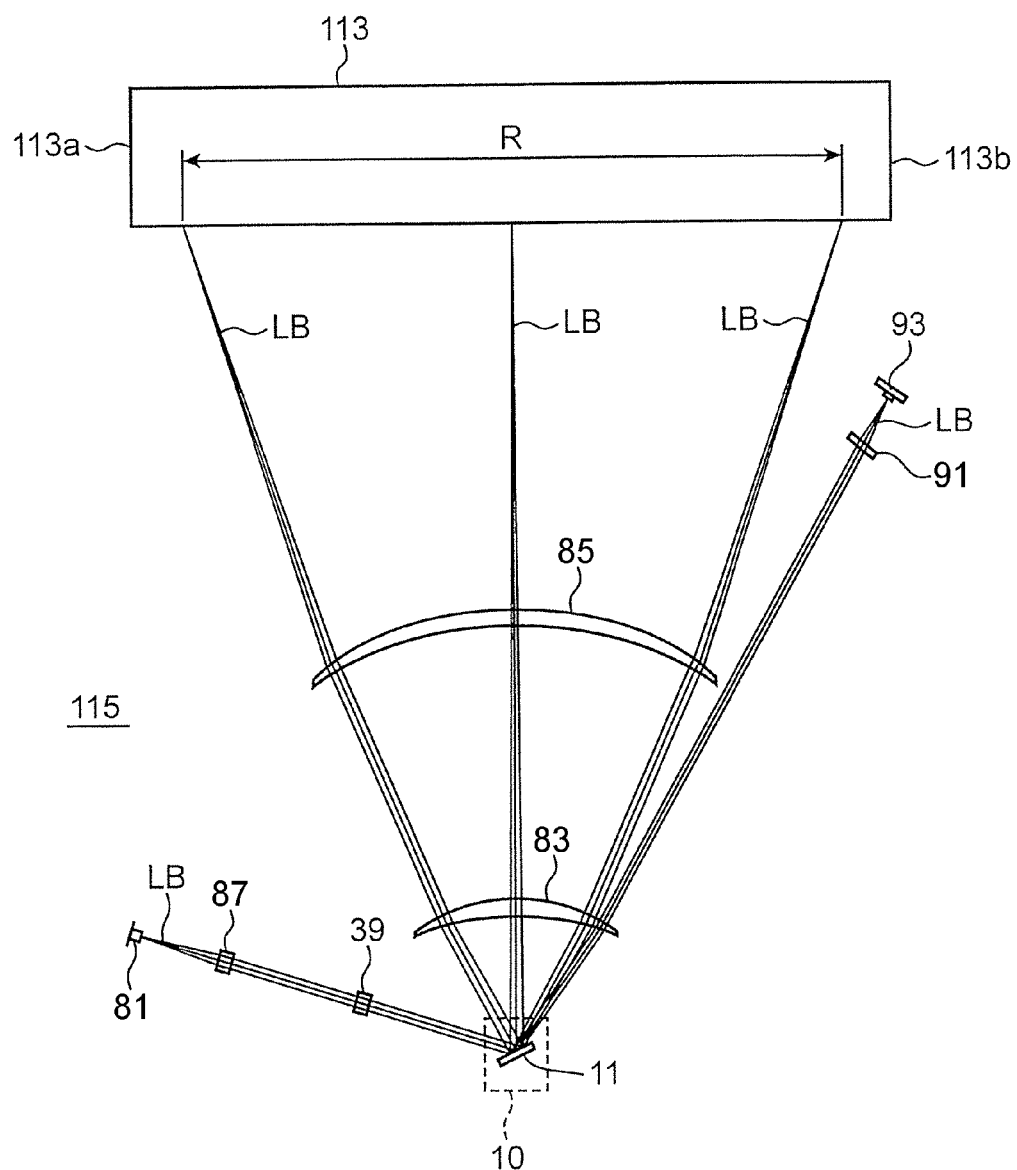
FIG. 3 is a diagram showing an arrangement relationship of optical components constituting an optical scanning device provided in the image forming apparatus shown in FIG. 1.

FIG. 3 is a diagram showing an arrangement relationship of optical components constituting the optical scanning device 115. The optical scanning device 115 includes a light source 81, a light deflector 10, two scanning lenses 83, 85 and the like. The light source 81 is, for example, a laser diode and emits a light beam LB modulated in accordance with image data.

A collimator lens 87 and a cylindrical lens 39 are arranged on an optical path between the light source 81 and the light deflector 10. The collimator lens 87 converts the light beam LB emitted from the light source 81 into a parallel beam. The cylindrical lens 39 linearly condenses the light beam LB converted into the parallel beam. The linearly condensed light beam LB is incident on the light deflector 10.

The scanning lenses 83, 85 are arranged on an optical path between the light deflector 10 and the photoconductive drum 113. The light beam LB incident on a mirror portion 11 of the light deflector 10 is reflected and deflected by the mirror portion 11 and focused on the photoconductive drum 113 by the scanning lenses 83, 85. That is, by scanning the light beam LB across the photoconductive drum 113, an electrostatic latent image is formed on the photoconductive drum 113.

The optical scanning device 115 further includes a BD lens 91 and a BD sensor 93. The light beam LB is scanned across the photoconductive drum 113 from one lateral part 113a to another lateral part 113b of the photoconductive drum 113, and the light beam LB beyond an effective scanning range is condensed by the BD lens 91 and received by the BD sensor 93. The BD (Beam Detect) sensor 93 generates a BD signal serving as a reference for the start of scanning (main scanning) on the photoconductive drum 113.

Figure 4:
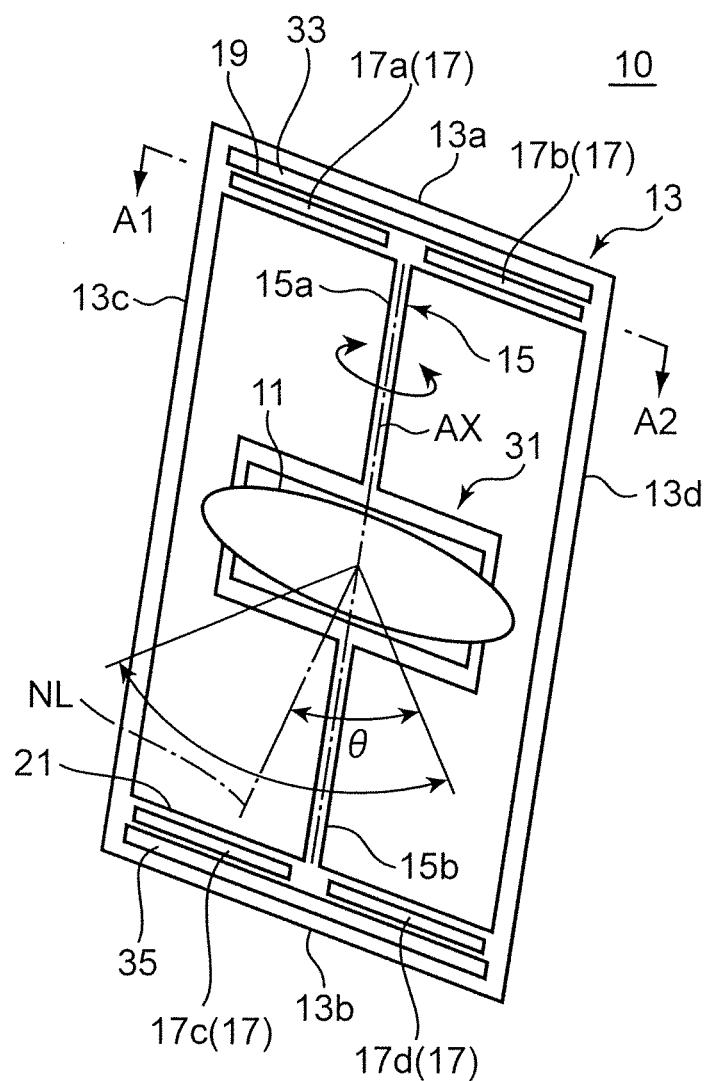
FIG. 4 is a perspective view of the light deflector according to the embodiment.
Figure 5:
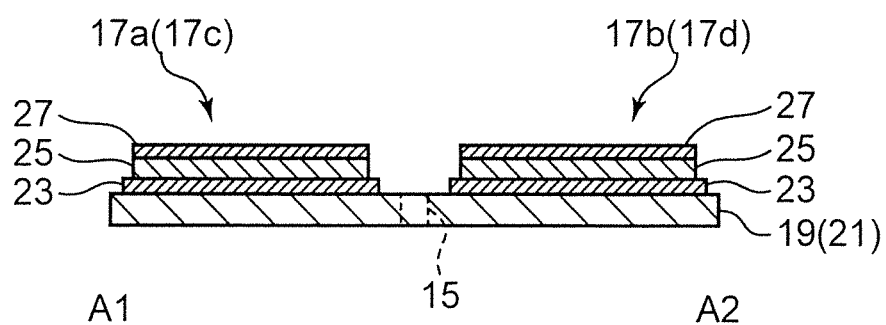
FIG. 5 is a sectional view cut along a line A1-A2 showing the light deflector shown in FIG. 4.

Next, the light deflector 10 according to this embodiment is described. FIG. 4 is a perspective view of the light deflector 10 according to the embodiment, and FIG. 5 is a sectional view cut along a line A1-A2 showing the light deflector shown in FIG. 4. The light deflector 10 according to this embodiment is a piezoelectrically driven MEMS mirror. However, the MEMS mirror usable as the light deflector 10 is not limited to the piezoelectrically driven one.

The light deflector 10 includes the mirror portion 11, a frame 13, a torsion bar 15, mirror drivers 17a, 17b, 17c and 17d, and a supporting body 31.

The frame 13 has a rectangular shape. The frame 13 is composed of a pair of side portions 13c, 13d extending in a longitudinal direction, a pair of side portions 13a, 13b extending in a direction perpendicular to the longitudinal direction, and beams 19, 21 (fixing portion) connecting the side portions 13c, 13d. The mirror portion 11 is arranged in a central part of the frame 13. The mirror portion 11 has an elliptical shape whose minor axis direction matches the longitudinal direction of the frame 13.

The torsion bar 15 has an axis AX extending in one direction and serving as a rotation axis (can be also referred to as a torsional rotation axis or a swing axis). The torsion bar 15 includes a first torsion bar 15a and a second torsion bar 15b extending along the common axis AX. The first and second torsion bars 15a, 15b extend in the minor axis direction of the elliptical shape of the mirror portion 11. One end of the first torsion bar 15a is fixed and supported by the beam 19 and one end of the second torsion bar 15b is fixed and supported by the beam 21.

A space 33 is formed between the beam 19 and the side portion 13a, and a space 35 is formed between the beam 21 and the side portion 13b.

The supporting body 31 supporting the mirror portion 11 is fixed to the other ends of the first and second torsion bars 15a, 15b. The supporting body 31 is arranged in the frame 13. The supporting body 31 has a rectangular shape and a longitudinal direction thereof is perpendicular to that of the frame 13. The beams 19, 21 (fixing portion) fix and support the torsion bar 15 in such a manner that the mirror portion 11 supported by the supporting body 31 is swingable about the axis AX of the torsion bar 15.

As described above, the mirror portion 11 deflects light by swinging about a predetermined swing axis, the torsion bar 15 is fixed and supported by the fixing portion (beams 19, 21) and has the axis AX serving as the swing axis, and the supporting body 31 supports the mirror portion 11 and is fixed to the torsion bar 15.

On the beam 19, the mirror driver 17a is formed on a side closer to the side portion 13c than the torsion bar 15 and the mirror driver 17b is formed on a side closer to the side portion 13d than the torsion bar 15. On the beam 21, the mirror driver 17c is formed on a side closer to the side portion 13c than the torsion bar 15 and the mirror driver 17d is formed on a side closer to the side portion 13d than the torsion bar 15.

As shown in FIG. 5, the mirror driver 17a is composed of a lower electrode 23, a PZT thin film 25 and an upper electrode 27. The mirror drivers 17b, 17c and 17d have the same configuration as the mirror driver 17a. The mirror drivers 17a, 17b, 17c and 17d are written as the mirror drivers 17 below unless it is necessary to distinguish them.

Figure 6:
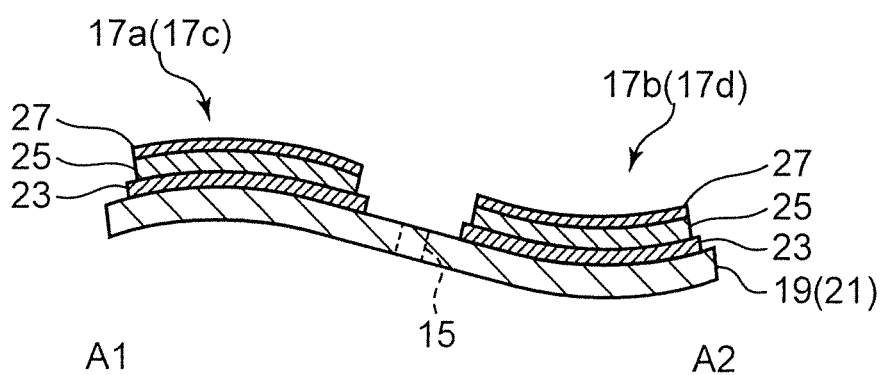
FIG. 6 is a view showing a state where a PZT thin film of a mirror driver on one side extends and that of a mirror driver on the other side contracts in the same cross-section as in FIG. 5.

FIG. 6 is a view showing a state where a drive voltage is applied to the mirror drivers 17 so that the PZT thin films 25 of the mirror drivers 17a, 17c extend and those of the mirror drivers 17b, 17d contract in the same cross-section as in FIG. 5. In FIG. 6, the beams 19, 21 are bended, whereby the mirror portion 11 is inclined together with the torsion bar 15.

The extension of the PZT thin films 25 of the mirror drivers 17a, 17c and the contraction of the PZT thin films 25 of the mirror drivers 17b, 17d are described as a first movement and the contraction of the PZT thin films 25 of the mirror drivers 17a, 17c and the extension of the PZT thin films 25 of the mirror drivers 17b, 17d are described as a second movement below. By applying a drive voltage to the mirror drivers 17 to deflect the beams 19, 21 so that the first and second movements are alternately repeated, the mirror portion 11 supported by the supporting body 31 swings about the axis AX of the torsion bar 15 to vary a deflection angle θ. Note that NL in FIG. 4 denotes a normal to the mirror portion 11 when the mirror portion 11 is not swinging.

When a frequency of the drive voltage is caused to match a resonant frequency, the mirror portion 11 resonates and a maximum value of the deflection angle θ (maximum deflection angle) can be increased. By reflecting and deflecting a light beam by the mirror portion 11 in a state where the mirror portion 11 is resonated, the light beam is scanned across the photoconductive drum 113.

Figure 7:
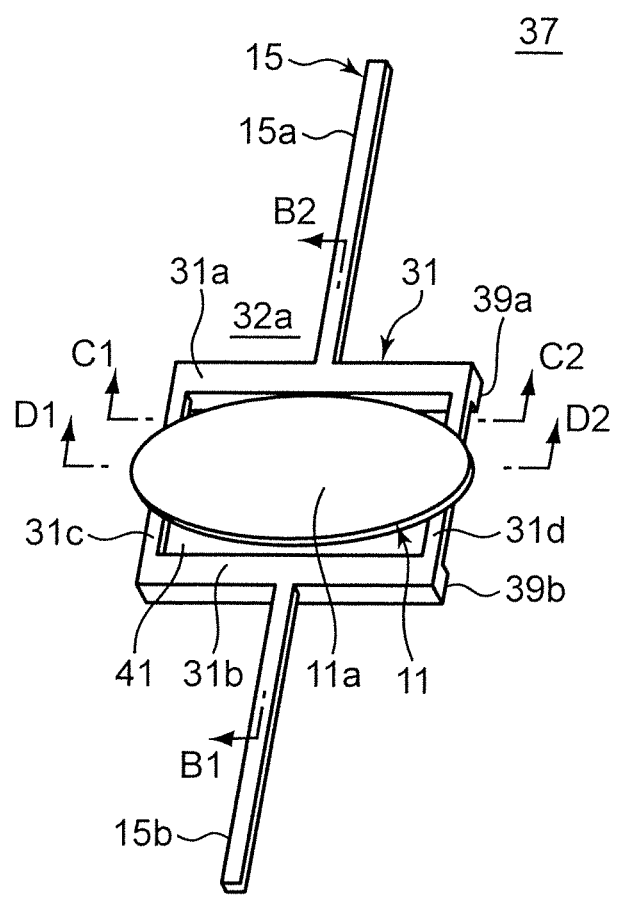
FIG. 7 is a perspective view showing a mirror portion, a torsion bar, a supporting body and a movable portion with a first rib and a second rib provided in the light deflector according to the embodiment when viewed from a top surface (light beam reflecting/deflecting surface) side of the mirror portion.
Figure 8:
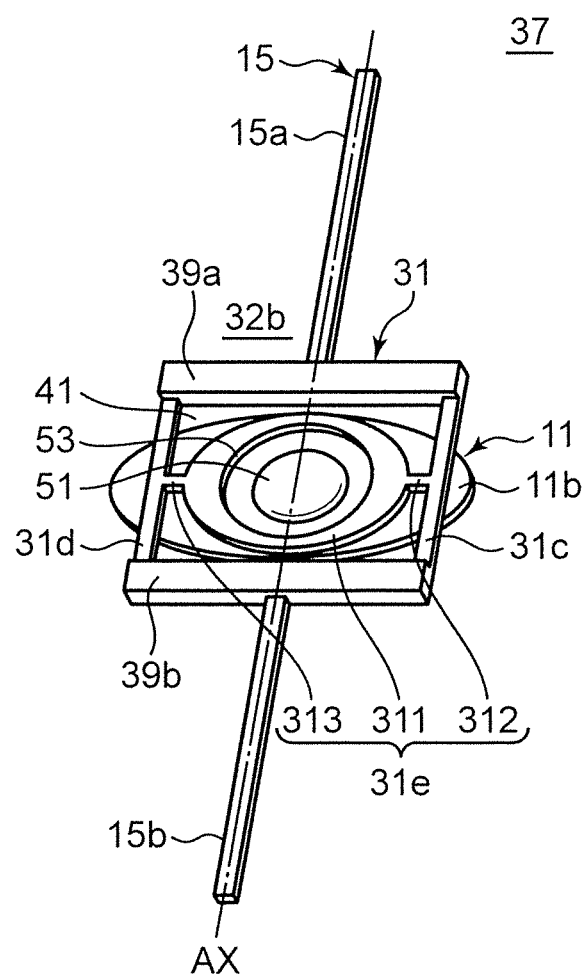
FIG. 8 is a perspective view of the movable portion viewed from an under surface side of the mirror portion.

FIG. 7 is a perspective view showing the mirror portion 11, the torsion bar 15, the supporting body 31 and a movable portion 37 with a first rib 39a and a second rib 39b provided in the light deflector 10 when viewed from the side of a top surface 11a (light beam reflecting/deflecting surface) of the mirror portion 11. FIG. 8 is a perspective view showing this movable portion 37 viewed from the side of an under surface 11b of the mirror portion 11.

The top surface 11a of the mirror portion 11 is on the side of one surface 32a (supporting surface) of the supporting body 31, and the under surface 11b of the mirror portion 11 is supported by the one surface 32a of the supporting body 31.

The supporting body 31 has a rectangular frame-like shape and includes a first supporting member 31a, a second supporting member 31b, a third supporting member 31c and a fourth supporting member 31d which serve as four sides forming a rectangle.

The first and second supporting members 31a, 31b extend straight in a direction intersecting with an extending direction of the torsion bar 15 and are arranged to face each other.

The third and fourth supporting members 31c, 31d extend straight in the same direction as the extending direction of the torsion bar 15 and are symmetrically arranged with respect to the torsion bar 15.

A space 41 is defined by the first, second, third and fourth supporting members 31a, 31b, 31c and 31d. The supporting body 31 is made lighter by providing the space 41.

As described above, the supporting body 31 includes the first supporting member 31a extending in the direction intersecting with the torsion bar 15, the second supporting member 31b arranged to face the first supporting member 31a and extending in the direction intersecting with the torsion bar 15, the third supporting member 31c connecting the first and second supporting members 31a, 31b and the fourth supporting member 31d symmetrically arranged to the third supporting member 31c with respect to the axis of the torsion bar 15 and connecting the first and second supporting members 31a, 31b.

The supporting body 31 further includes a fifth supporting member 31e arranged in the space 41. The fifth supporting member 31e includes a main body portion 311, a first connecting portion 312 and a second connecting portion 313. The main body portion 311 is a main body of the fifth supporting member 31e and formed with a circular cavity which functions as a hole portion 53. This makes the supporting body 31 lighter.

The mirror portion 11 is a plate-like member including a deflecting surface (top surface 11a) for deflecting light and a non-deflecting surface (under surface 11b) opposite to the deflecting surface. The non-deflecting surface (under surface 11b) forms the bottom of the hole portion 53.

The first connecting portion 312 is arranged on a major axis of the main body portion 311 and connects one end part of the main body portion 311 and a center of the third supporting member 31c. The second connecting portion 313 is arranged on the major axis of the main body portion 311 and connects the other end part of the main body portion 311 and a center of the fourth supporting member 31d.

As described above, the torsion bar 15 is composed of the first and second torsion bars 15a, 15b. The first and second torsion bars 15a, 15b extend in the same direction and are arranged with a spacing provided therebetween. The supporting body 31 is arranged in an area including this spacing. The first torsion bar 15a is fixed to the first supporting member 31a in a center of the first supporting member 31a. The second torsion bar 15b is fixed to the second supporting member 31b in a center of the second supporting member 31b.

As shown in FIG. 7, each of the first, second, third, fourth and fifth supporting members 31a, 31b, 31c, 31d and 31e and the first and second torsion bars 15a, 15b includes a planar portion facing toward the side of the one surface 32a of the supporting body 31, and each planar portion is located on the same plane. These have the same height (i.e. same thickness).

The mirror portion 11 is provided on the one surface 32a of the supporting body 31. The mirror portion 11 is bonded to the third, fourth and fifth supporting members 31c, 31d and 31e using an adhesive or joined to the third, fourth and fifth supporting members 31c, 31d and 31e by anode junction.

The first and second ribs 39a, 39b, which are ribs extending in the direction intersecting with the torsion bar 15, are provided on the other surface 32b (opposite surface) of the supporting body 31. The first rib 39a is provided on the first supporting member 31a and the second rib 39b is provided on the second supporting member 31b.

Figure 9:
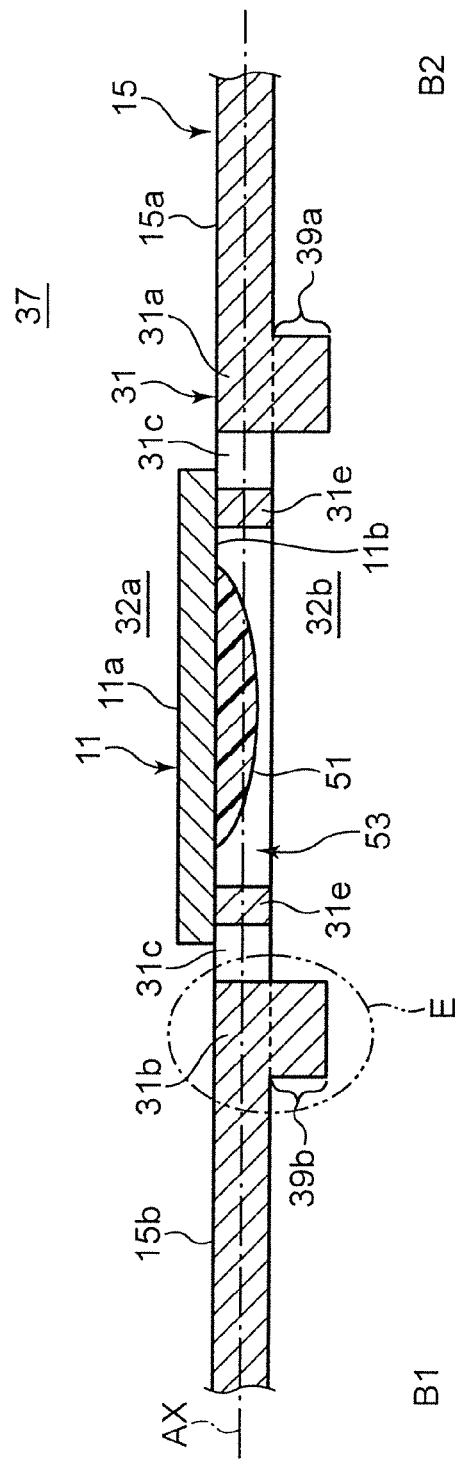
FIG. 9 is an enlarged sectional view cut along a line B1-B2 showing the movable portion shown in FIG. 7.
Figure 10:
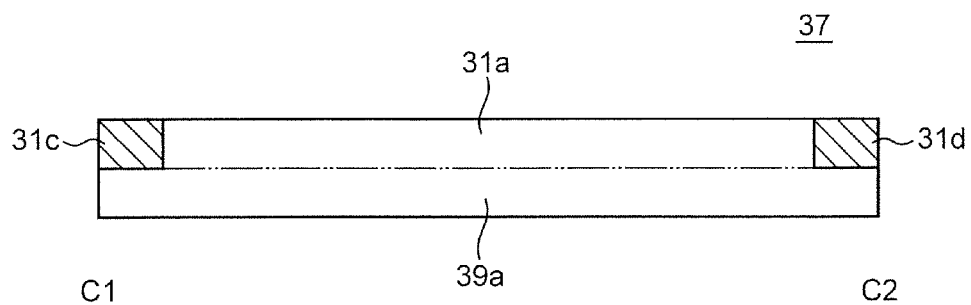
FIG. 10 is an enlarged sectional view cut along a line C1-C2 showing the movable portion shown in FIG. 7.
Figure 11:
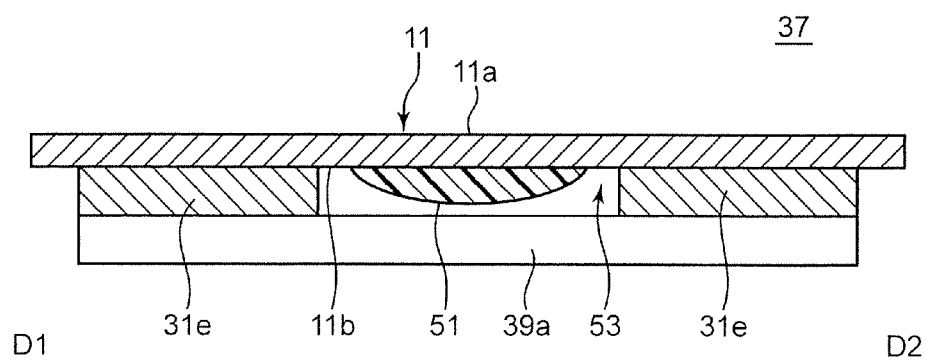
FIG. 11 is an enlarged sectional view cut along a line D1-D2 showing the movable portion shown in FIG. 7.

The first and second ribs 39a, 39b are described in detail. FIG. 9 is an enlarged sectional view cut along a line B1-B2 showing the movable portion 37 shown in FIG. 7. FIG. 10 is an enlarged sectional view cut along a line C1-C2 showing the movable portion 37 shown in FIG. 7. FIG. 11 is an enlarged sectional view cut along a line D1-D2 showing the movable portion 37 shown in FIG. 7.

With reference to FIGS. 7 to 11, the supporting members 31 (first, second, third, fourth and fifth supporting members 31a, 31b, 31c, 31d and 31e) and the torsion bar 15 (first and second torsion bars 15a, 15b) have the same thickness. As show in FIG. 9, the first rib 39a is a part formed to be continuous with the first supporting member 31a and projecting from the supporting body 31 on the other surface 32b of the supporting body 31. The second rib 39b is a part formed to be continuous with the second supporting member 31b and projecting from the supporting body 31 on the other surface 32b of the supporting body 31. As just described, the first rib 39a is provided on the first supporting member 31a, extends in the direction intersecting with the torsion bar 15 and projects on the side of the other surface 32b of the supporting body 31. The second rib 39b is provided on the second supporting member 31b, extends in the direction intersecting with the torsion bar 15 and projects on the side of the other surface 32b of the supporting body 31.

In other words, the supporting body 31 includes a contact surface to be held in contact with the mirror portion 11 and a non-contact surface opposite to the contact surface. The first rib 39a is so provided on the first supporting member 31a as to extend in the direction intersecting with the torsion bar 15 and project on the non-contact surface side. The second rib 39b is so provided on the second supporting member 31b as to extend in the direction intersecting with the torsion bar 15 and project on the non-contact surface side.

The first and second supporting members 31a, 31b and the first and second ribs 39a, 39b have the same length. Further, these have the same width. A mass of the first rib 39a and that of the second rib 39b are equal. A total mass of the first and second ribs 39a, 39b is equal to a mass of the mirror portion 11.

Figure 12:
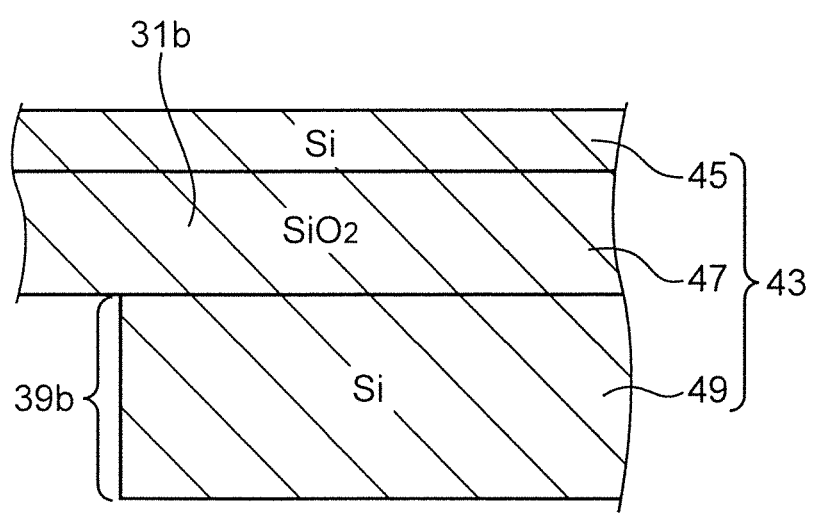
FIG. 12 is a sectional view enlargedly showing a part indicated by E in FIG. 9.

FIG. 12 is a sectional view enlargedly showing a part indicated by E in FIG. 9. An SOI (Silicon on Insulator) substrate 43 is structured such that a silicon oxide film 47 is sandwiched between silicon layers 45 and 49. The supporting body 31 and the torsion bar 15 are formed by the silicon layer 45 and the silicon oxide film 47. The first and second ribs 39a, 39b are formed by the silicon layer 49. The torsion bar 15, the supporting body 31 and the first and second ribs 39a, 39b are formed by selectively etching the SOI substrate 43.

Note that the first and second ribs 39a, 39b may be respectively bonded to the first and second supporting members 31a, 31b by an adhesive or joined thereto by anode junction.

The first and second ribs 39a, 39b are provided only on the other surface 32b out of the one surface 32a and the other surface 32b of the supporting body 31 and function as reinforcing members for reinforcing the supporting body 31 and adjusting a center of gravity of the movable portion 37 including the torsion bar 15, the supporting body 31 and the mirror portion 11 so that the center of gravity of the movable portion 37 is located on the axis AX.

Next, a mass body 51 is described using FIGS. 8, 9 and 11. As described above, the hole portion 53 is provided in the main body portion 311 of the fifth supporting member 31e. Specifically, the supporting body 31 is provided with the hole portion 53. The hole portion 53 has a depth in a direction intersecting with the one surface 32a (supporting surface) of the supporting body 31 and located on the axis AX of the torsion bar 15. The axis AX passes through the hole portion 53. The hole portion 53 penetrates through the supporting body 31 and the surface of the mirror portion 11 (under surface 11b of the mirror portion) opposite to the surface for reflecting light serves as a bottom part of the hole portion 53. The mass body 51 is arranged in the hole portion 53. The mass body 51 is located on the axis AX of the torsion bar 15. The resonant frequency of the movable portion 37 is adjusted by the mass body 51 arranged in the hole portion 53.

The mass body 51 is a member formed by curing an adhesive fluid. Accordingly, an adhesive, putty or the like can be formed into the mass body 51. In this embodiment, an ultraviolet curing adhesive, which is one of photocurable adhesives, is formed into the mass body 51.

Figure 13:
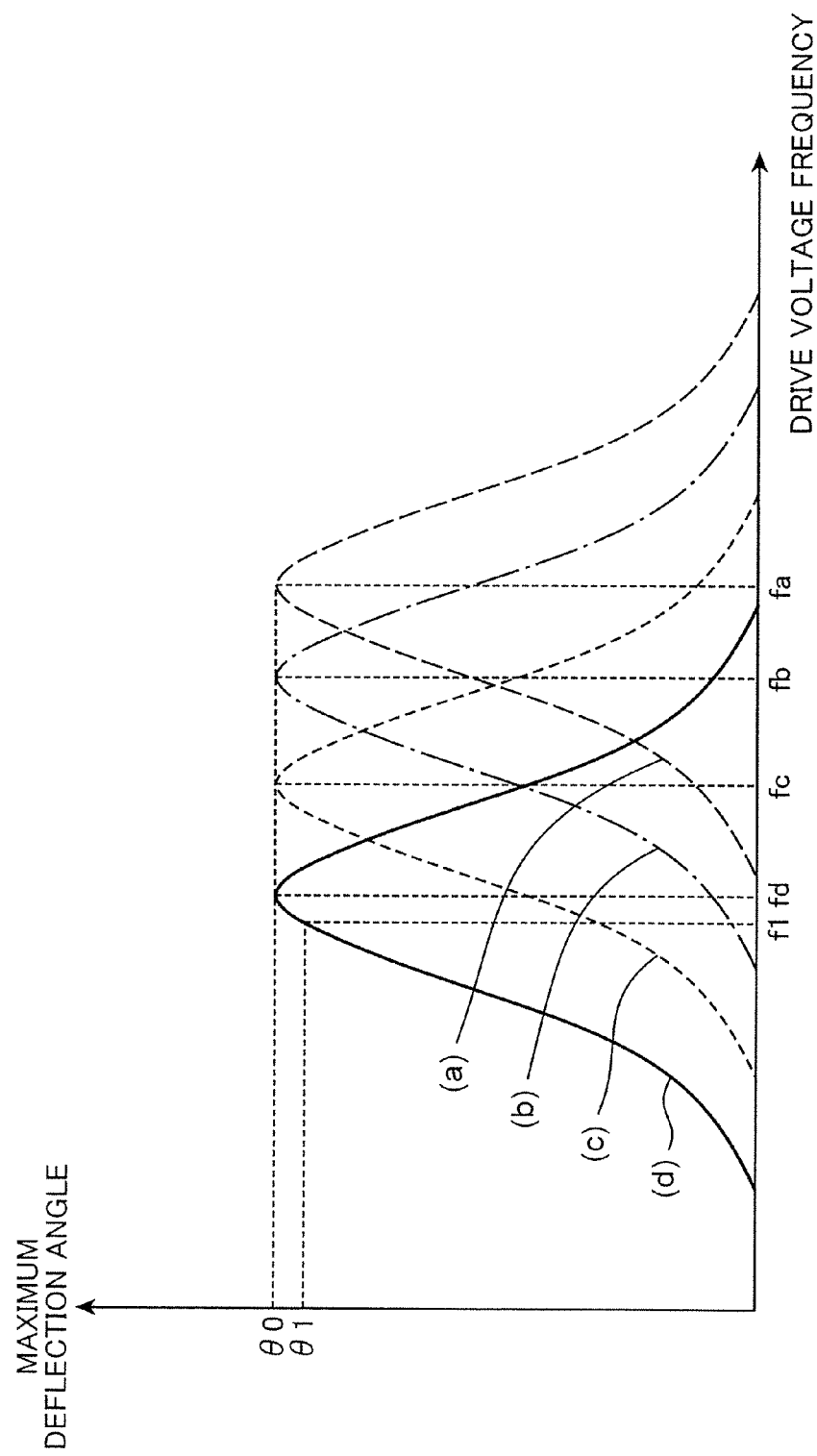
FIG. 13 is a graph showing a relationship between a frequency of a drive voltage input to the light deflector and a maximum deflection angle of the mirror portion.

An adjustment of the resonant frequency using the mass body is described. FIG. 13 is a graph showing a relationship between a frequency of a drive voltage input to the light deflector 10 and the maximum deflection angle of the mirror portion 11. A horizontal axis of the graph represents the frequency of the drive voltage and a vertical axis thereof represents the maximum deflection angle.

A curve (a) represents a case where the mass body 51 is not supplied to the hole portion 53 of the supporting body 31, and fa denotes the resonant frequency in this case. A curve (b) represents a case where the mass of the mass body 51 supplied to the hole portion 53 of the supporting body 31 has a first value, and fb denotes the resonant frequency in this case. A curve (c) represents a case where the mass of the mass body 51 supplied to the hole portion 53 of the supporting body 31 has a second value larger than the first value, and fc denotes the resonant frequency in this case. A curve (d) represents a case where the mass of the mass body 51 supplied to the hole portion 53 of the supporting body 31 has a third value larger than the second value, and fd denotes the resonant frequency in this case. An example of using the light deflector 10 with the frequency of the drive voltage input to the light deflector 10 set at f1 and a target value of the maximum deflection angle set at θ1 is described.

In the respective cases of the curves (a) to (d), the maximum deflection angle at the resonant frequency has the same value (θ0). The resonant frequency decreases as the mass of the mass body 51 supplied to the hole portion 53 increases (curve (a)→curve (b)→curve (c)→curve (d)). Thus, by adjusting the mass of the mass body 51 supplied to the hole portion 53 to adjust the resonant frequency in a state where the frequency of the drive voltage is f1, the maximum deflection angle can be set at the target value θ1 at the frequency f1 of the drive voltage.

Figure 14:
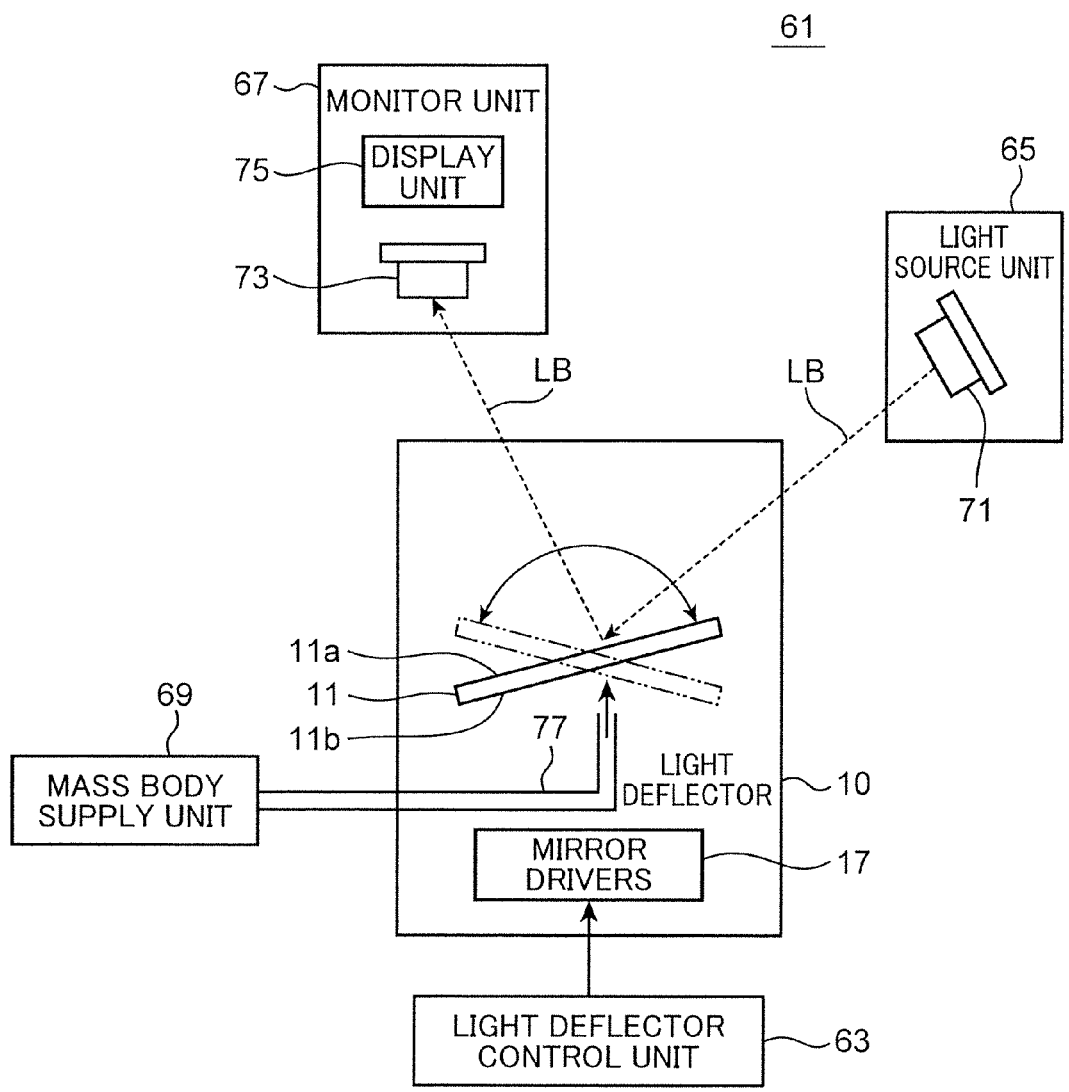
FIG. 14 is a block diagram of an adjustment system used in a process of adjusting a resonant frequency in a light deflector manufacturing method according to the embodiment.

FIG. 14 is a block diagram of an adjustment system 61 used in a process of adjusting the resonant frequency in a method for manufacturing the light deflector 10 according to this embodiment. The adjustment system 61 includes a light deflector control unit 63, a light source unit 65, a monitor unit 67 and a mass body supply unit 69.

The light deflector control unit 63 swings the mirror portion 11 about the axis AX of the torsion bar 15 shown in FIG. 4 by inputting a drive voltage to the mirror drivers 17 of the light deflector 10.

The light source unit 65 includes a laser diode 71 and controls the irradiation of a light beam LB from the laser diode 71 toward the mirror portion 11.

The monitor unit 67 includes a photodiode 73 and a display unit 75, and computes the maximum deflection angle of the mirror portion 11 and causes the display unit 75 to display a measurement value, utilizing a time interval until the next light reception after the light beam LB reflected by the top surface 11a of the mirror portion 11 is received by the photodiode 73.

Figure 15:
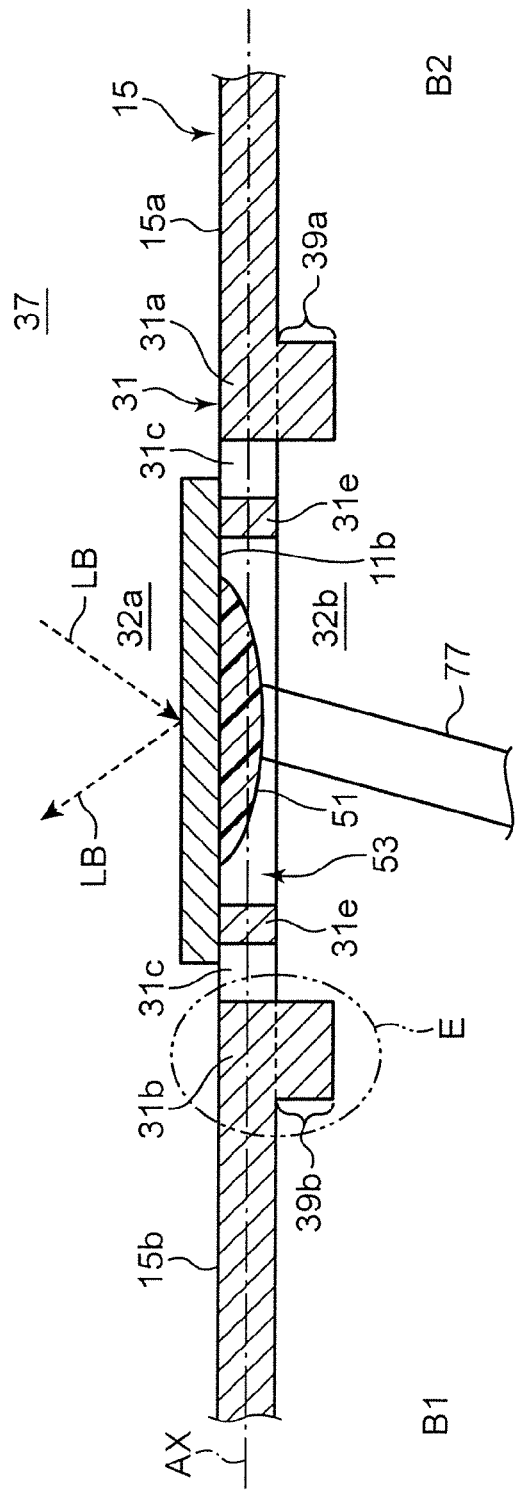
FIG. 15 is a view showing a state where a mass body is supplied to a hole portion of the supporting body using a nozzle in the same cross-section as in FIG. 9.

The mass body supply unit 69 includes a nozzle 77 and supplies the mass body 51 to the hole portion 53 (FIG. 8) of the supporting body 31 using the nozzle 77. In this embodiment, a dispenser for discharging the ultraviolet curing adhesive from the nozzle 77 is used as the mass body supply unit 69. FIG. 15 shows a state where the mass body 51 is supplied to the hole portion 53 of the supporting body 31 using the nozzle 77 in the same cross-section as in FIG. 9.

Figure 16:
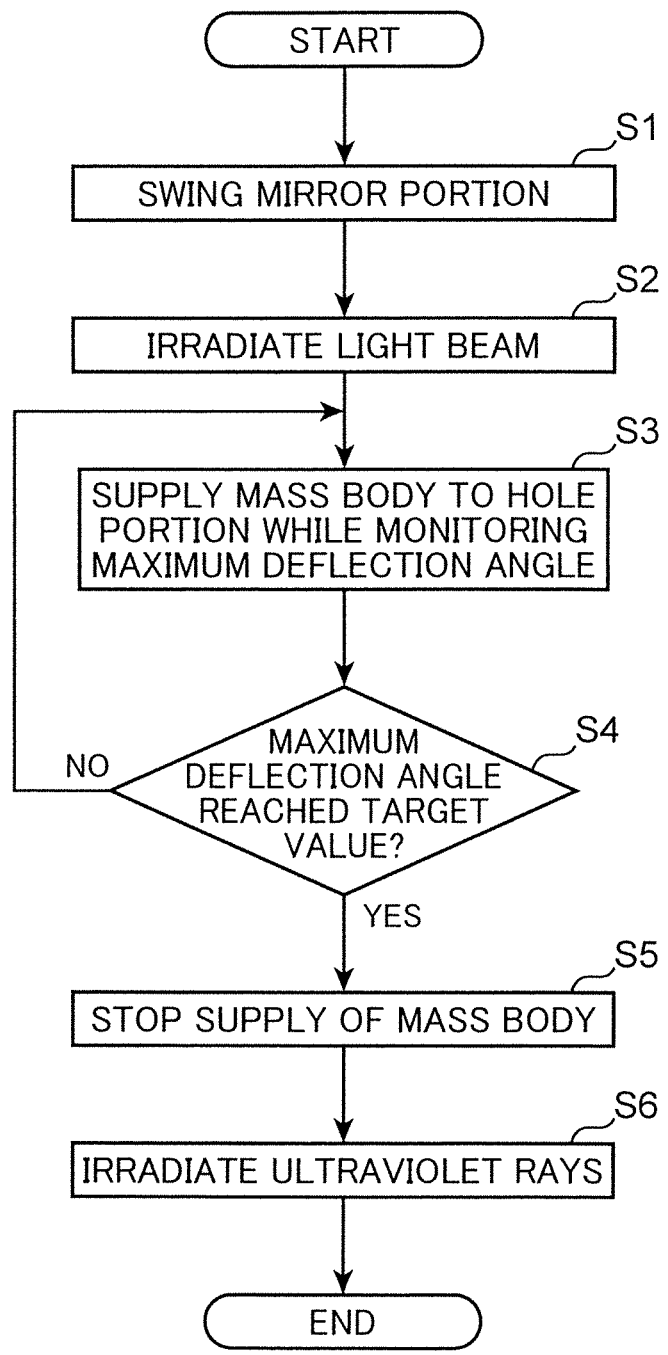
FIG. 16 is a flow chart showing the process of adjusting the resonant frequency in the light deflector manufacturing method according to the embodiment.

FIG. 16 is a flow chart showing the process of adjusting the resonant frequency in the method for manufacturing the light deflector 10 according to this embodiment.

The light deflector control unit 63 swings the mirror portion 11 by inputting a drive voltage having a predetermined voltage value and a frequency f1 to the light deflector 10, i.e. to the mirror drivers 17 in a state where the mass body 51 is not supplied to the hole portion 53 of the supporting body 31 yet (Step S1). Note that if the mirror portion 11 is electromagnetically driven instead of being piezoelectrically driven, the mirror portion 11 is swung by inputting a drive current having a predetermined current value and the frequency f1 to the light deflector 10.

The light source unit 65 causes a light beam LB to be generated from the laser diode 71 and irradiates the light beam LB to the top surface 11a of the mirror portion 11 in a swinging state (Step S2).

In a state of Step S2, an adjuster of the resonant frequency operates the mass body supply unit 69 to supply the mass body 51 (ultraviolet curing adhesive) in a fluid state to the hole portion 53 of the supporting body 31 while monitoring the maximum deflection angle (in other words, resonant frequency) displayed on the display unit 75 of the monitor unit 67 (Step S3).

The adjuster judges whether or not the maximum deflection angle displayed on the display unit 75 has reached the target value θ1 during Step S3 (Step S4).

If the maximum deflection angle has not reached the target value θ1 (No in Step S4), a return is made to Step S3.

If the maximum deflection angle reaches the target value θ1 (Yes in Step S4), the adjuster stops the supply of the mass body 51 to the hole portion 53 of the supporting body 31 from the mass body supply unit 69 (Step S5). Thereafter, the adjuster allows the mass body 51 to be cured by irradiating ultraviolet rays to the mass body 51 supplied to the hole portion 53 of the supporting body 31 using an ultraviolet irradiation device (Step S6).

By the above, it is possible to obtain the light deflector 10 in which the maximum deflection angle of the mirror portion 11 reaches the target value θ1 when the drive voltage has the frequency f1.

Main effects of this embodiment are described. According to this embodiment, since the axis AX of the torsion bar 15 passes through the hole portion 53 in which the mass body 51 is to be arranged as shown in FIG. 8, the mass body 51 can be arranged on the axis AX of the torsion bar 15. Thus, a change in the moment of inertia of the mass body 51 (i.e. a change in the moment of inertia of the movable portion 37 of the light deflector 10) in response to a change in the mass of the mass body 51 becomes relatively small. Thus, the resonant frequency can be finely adjusted in the case of adjusting the resonant frequency of the movable portion 37 of the light deflector 10 while adjusting the mass of the mass body 51, wherefore accuracy in adjusting the resonant frequency can be improved.

Further, according to this embodiment, the axis AX of the torsion bar 15 passes through the hole portion 53 in which the mass body 51 is to be arranged. Thus, as compared with the case where the hole portion 53 is not provided, the mass body 51 is easily arranged on the axis AX of the torsion bar 15 so as not to deviate from the axis AX of the torsion bar 15.

As described in the description of the background art, if a mirror portion is made larger toward both left and right sides, a first area and a second area symmetrical with respect to a torsion bar are respectively provided and a mass body is provided in each area, a lateral dimension of a light deflector becomes larger by the first and second areas. Since the hole portion 53 is arranged on the axis AX of the torsion bar 15 in this embodiment, the lateral dimension of the light deflector 10 does not become larger due to the provision of the hole portion 53.

Since the hole portion 53 in which the mass body 51 is to be arranged is located on the axis AX of the torsion bar 15, the hole portion 53 is displaced only to a slight extent even if the mirror portion 11 is swung. Thus, the mass body 51 in a fluid state can be easily poured into the hole portion 53 while the mirror portion 11 is swung. As shown in FIG. 14, according to this embodiment, the mass body 51 in the fluid state is supplied to the hole portion 53 (FIG. 15) while the mirror portion 11 is swung and the maximum deflection angle of the mirror portion 11 is monitored. Thus, a time required for the adjustment of the resonant frequency can be shortened as compared with the case where a step of monitoring the maximum deflection angle of the mirror portion 11 and a step of supplying the mass body 51 in the fluid state to the hole portion 53 are separately performed.

In the case of adjusting the resonant frequency by forming the mass body in the supporting body 31 in advance and cutting the mass body by a laser beam or the like, particles are unavoidably produced and may contaminate or damage the top surface 11a (surface for reflecting light) of the mirror portion 11. In this embodiment, the mass body 51 is formed in the hole portion 53 by supplying the mass body 51 in the fluid state to the hole portion 53. Thus, particles are not produced, wherefore there is no problem of contaminating or damaging the top surface 11a of the mirror portion 11 due to particles.

According to this embodiment, one hole portion 53 is provided and one mass body 51 is arranged in the hole portion 53. Thus, the adjustment of the resonant frequency can be speeded up as compared with a configuration in which the mass body 51 is arranged in each of a plurality of hole portions 53.

With reference to FIGS. 7 and 8, the first supporting member 31a is fixed to the torsion bar 15a in the center thereof. Thus, a moment of inertia acting on the first supporting member 31a when the mirror portion 11 is swung about the axis AX of the torsion bar 15 increases with distance from the first torsion bar 15a. Similarly, since the second supporting member 31b is fixed to the torsion bar 15b in the center thereof, a moment of inertia acting on the second supporting member 31b when the mirror portion 11 is swung about the axis AX of the torsion bar 15 increases with distance from the second torsion bar 15b.

Contrary to this, the extending directions of the third and fourth supporting members 31c, 31d are the same as that of the torsion bar 15. Thus, the first and second supporting members 31a, 31b are more easily bended than the third and fourth supporting members 31c, 31d when the mirror portion 11 is swung. The supporting body 31 is bended if the first and second supporting members 31a, 31b are bended, with the result that the mirror portion 11 is bended.

If ribs are provided on all the first, second, third and fourth supporting members 31a, 31b, 31c and 31d to suppress the bend of the mirror portion 11, a mass of the supporting body 31 increases.

Accordingly, in this embodiment, the first rib 39a extending in the direction intersecting with the torsion bar 15 is provided on the first supporting member 31a extending in the direction intersecting with the torsion bar 15 and the second rib 39b extending in the direction intersecting with the torsion bar 15 is provided on the second supporting member 31b extending in the direction intersecting with the torsion bar 15.

By the above, according to this embodiment, the bend of the mirror portion 11 when the mirror portion 11 is swung can be suppressed while the supporting body 31 is made lighter.

The mirror portion 11 is mounted on the third, fourth and fifth supporting members 31c, 31d and 31e without being mounted on the first and second supporting members 31a, 31b. Thus, even if the first and second supporting members 31a, 31b are bended a little, such bend is not directly transmitted to the mirror portion 11. Therefore, the bend of the mirror portion 11 can be reduced.

According to this embodiment, the mirror portion 11 is provided on the one surface 32a of the supporting body 31, the first and second ribs 39a, 39b are provided on the other surface 32b, and the total mass of the first and second ribs 39a, 39b is equal to the mass of the mirror portion 11. Since this makes a mass on the side of the one surface 32a of the supporting body 31 and that on the side of the other surface 32b equal, the center of gravity of the movable portion 37 configured by the torsion bar 15 and the like can be so adjusted as to be located on the axis AX of the torsion bar 15. Therefore, the moment of inertia can be balanced between the side of the one surface 32a of the supporting body 31 and the side of the other surface 32b.

Specifically, as shown in FIG. 9, the center of gravity of the movable portion 37 configured by the mirror portion 11, the supporting body 31, the first rib 39a, the second rib 39b, the first torsion bar 15a and the second torsion bar 15b can be located on the axis AX as center axes of the first and second torsion bars 15a, 15b. Thus, when the mirror portion 11 is swung about the axis AX of the torsion bar 15, movements of the mirror portion 11 other than swinging movements about the axis AX of the torsion bar 15 can be suppressed.

The same mass mentioned here means that the total mass of the first and second ribs 39a, 39b is completely or substantially equal to the mass of the mirror portion 11. To be substantially equal means that a difference between the total mass and the mass of the mirror portion 11 is in a range capable of suppressing movements of the mirror portion 11 other than swinging movements about the axis AX of the torsion bar 15 when the mirror portion 11 is swung about the axis AX of the torsion bar 15.

Further, according to this embodiment, the ribs (first rib 39a, second rib 39b) are provided on the other surface 32b of the supporting body 31, but not on the one surface 32a as shown in FIGS. 7 and 8. As shown in FIGS. 7 and 8, the surfaces of the first, second, third, fourth and fifth supporting members 31a, 31b, 31c, 31d and 31e and the first and second torsion bars 15a, 15b are located on the same plane on the side of the one surface 32a of the supporting body 31. Thus, it is not necessary to etch both surfaces of the SOI substrate 43 and ribs can be formed by selectively etching one surface, wherefore the number of manufacturing steps of the light deflector 10 can be reduced. Hence, the cost of the light deflector 10 can be reduced.

As shown in FIG. 12, the supporting body 31 and the torsion bar 15 are formed by the silicon layer 45 and the silicon oxide film 47 of the SOI substrate 43. The first and second ribs 39a, 39b are formed by the silicon layer 49 of the SOI substrate 43. Thus, the thickness of the first rib 39a and that of the second rib 39b can be set at that of the silicon layer 49, wherefore the accuracy of the thickness of the first rib 39a and that of the second rib 39b (i.e. the accuracy of the total mass of the first and second ribs 39a, 39b) can be enhanced.

With reference to FIG. 9, the rigidity of the first torsion bar 15a becomes higher, for example, if the thickness of the first torsion bar 15a is set at a total value of the thickness of the first supporting member 31a and that of the first rib 39a. Similarly, the rigidity of the second torsion bar 15b becomes higher, for example, if the thickness of the second torsion bar 15b is set at a total value of the thickness of the second supporting member 31b and that of the second rib 39b. In this way, a swinging angle (i.e. the maximum value of the deflection angle θ shown in FIG. 4) of the mirror portion 11 becomes smaller.

Accordingly, in this embodiment, the thickness of the first torsion bar 15a is made smaller than the total value of the thickness of the first supporting member 31a and that of the first rib 39a, and the thickness of the second torsion bar 15b is made smaller than the total value of the thickness of the second supporting member 31b and that of the second rib 39b. In this way, the swinging angle of the mirror portion 11 is made larger.

Although the present disclosure has been fully described by way of example with reference to the accompanying drawings, it is to be understood that various changes and modifications will be apparent to those skilled in the art. Therefore, unless otherwise such changes and modifications depart from the scope of the present disclosure hereinafter defined, they should be construed as being included therein.

What is claimed is:

1. A light deflector, comprising:
a fixing portion; and
a movable portion including a mirror portion for deflecting light by swinging about a predetermined swing axis, a torsion bar fixedly supported on the fixing portion and having an axis serving as the swing axis, and a supporting body configured to support the mirror portion and fixed to the torsion bar;
wherein:
the movable portion includes a recess through which the axis passes; and
a mass body is arranged in the recess;
the mirror portion including a substantially planar deflecting surface for deflecting light and a non-deflecting surface opposite the deflecting surface; and
the recess in the movable portion is defined by a through hole portion that passes through the supporting body and one opening of the through hole is closed by the non-deflecting surface of the mirror portion so that the non-deflecting surface of the mirror portion closes the through hole portion and forms a closed bottom of the recess,
the mass body is an adhesive and has a cross section having a circular arc shape, the adhesive being applied to the non-deflecting surface of the mirror portion in an amount for adjusting a resonant frequency of the movable portion and being cured on the non-deflecting surface of the mirror portion,
the supporting body includes a first supporting member extending in a direction intersecting with the torsion bar, a second supporting member arranged to face the first supporting member and extending in a direction intersecting the torsion bar, a third supporting member connecting the first and second supporting members, a fourth supporting member arranged symmetrically to the third supporting member with respect to the torsion bar and connecting the first and second supporting members, a fifth supporting member including the hole portion, and a space defined by the first, second, third and fourth supporting members and having the fifth supporting member arranged therein;
the fifth supporting member connects the third and fourth supporting members;
the mirror portion is disposed on and supported by the third, fourth and fifth supporting members; and
the torsion bar includes a first torsion bar fixed to the first supporting member in a center of the first supporting member and a second torsion bar fixed to the second supporting member in a center of the second supporting member.

2. A light deflector according to claim 1, wherein:
one recess is provided and one mass body is arranged in the recess.

3. A light deflector according to claim 1, further composing a first rib and a second rib for reinforcing the supporting body, wherein:
the supporting body includes a contact surface to be held in contact with the mirror portion and a non-contact surface opposite to the contact surface;

the first rib extends in a direction intersecting with the torsion bar and is provided on the first supporting member to project on the non-contact surface side; and the second rib extends in a direction intersecting with the torsion bar and is provided on the second supporting member to project on the non-contact surface side.

4. A light deflector according to claim 3, wherein:

a total mass of the first and second ribs is equal to a mass of the mirror portion.

5. A light deflector according to claim 4, wherein:

the supporting body, the first torsion bar, the second torsion bar, the first rib and the second rib are formed by processing a substrate including a first silicon layer, a second silicon layer, and a silicon oxide film sandwiched between the first and second silicon layers;

the supporting body, the first torsion bar and the second torsion bar are formed by the first silicon layer and the silicon oxide film; and the first and second ribs are formed by the second silicon layer.

6. A light deflector according to claim 5, further comprising a mirror driver for generating a drive force for swinging the mirror portion supported by the supporting body about the axis of the torsion bar using a piezoelectric element.

7. A light deflector according to claim 1, wherein:

the mass body consists of a cured adhesive.

8. A method for manufacturing a light deflector according to claim 7, comprising:

a first step of swinging the mirror portion by inputting a drive signal to the light deflector in a state where the mass body is not arranged in the hole portion;

a second step of supplying the mass body in a fluid state to the hole portion during the execution of the first step; and a third step of stopping the supply of the mass body when the resonant frequency of the movable portion reaches a predetermined value during the execution of the second step.

9. A method for manufacturing a light deflector according to claim 8, wherein:

a frequency of the drive signal is a predetermined frequency in the first step;

the mass body in the fluid state is supplied to the hole portion in the second step while a maximum deflection angle of the mirror portion is monitored; and the supply of the mass body is stopped in the third step when the maximum deflection angle of the mirror portion reaches the predetermined value during the execution of the second step.

10. An optical scanning device, comprising:

a light deflector according to claim 1; and a light source for irradiating a light beam to the mirror portion.

11. A light deflector according to claim 1, wherein the mirror portion is bonded to the third, fourth and fifth supporting members using a second adhesive.

12. A light deflector according to claim 1, wherein the mirror portion is bonded to the third, fourth and fifth supporting members by anode junction.

13. A light deflector according to claim 1, wherein the mirror portion has an elliptical shape, and the third supporting member and the fourth supporting member are arranged in a major axis direction of the elliptical shape.

14. A light deflector, comprising:

a fixing portion; and a movable portion including:

a torsion bar fixedly supported on the fixing portion and having a swing axis;

a supporting body fixed to the torsion bar, a through hole passing through the supporting body and disposed so that the swing axis passes through the through hole;

a mirror including a substantially planar deflecting surface for deflecting light and a non-deflecting surface opposite the deflecting surface, the non-deflecting surface of the mirror being mounted to the supporting body and closing one side of the through hole and thereby forming a recess in the supporting body, with the non-deflecting surface of the mirror forming a bottom of the recess; and a mass body arranged in the recess and on the non-deflecting surface of the mirror, the mass body being an adhesive with a cross section having a circular arc shape and being applied in an amount for adjusting a resonant frequency of the movable portion and being cured on the non-deflecting surface of the mirror, the supporting body includes a first supporting member extending in a direction intersecting with the torsion bar, a second supporting member arranged to face the first supporting member and extending in a direction intersecting the torsion bar, a third supporting member connecting the first and second supporting members, a fourth supporting member arranged symmetrically to the third supporting member with respect to the torsion bar and connecting the first and second supporting members, a fifth supporting member including the hole portion, and a space defined by the first, second, third and fourth supporting members and having the fifth supporting member arranged therein;

the fifth supporting member connects the third and fourth supporting members;

the mirror portion is disposed on and supported by the third, fourth and fifth supporting members; and the torsion bar includes a first torsion bar fixed to the first supporting member in a center of the first supporting member and a second torsion bar fixed to the second supporting member in a center of the second supporting member.

15. A light deflector according to claim 14, wherein the mass body consists of an ultraviolet cured adhesive.

16. A light deflector according to claim 14, wherein the mirror portion is bonded to the third, fourth and fifth supporting members using a second adhesive.

17. A light deflector according to claim 14, wherein the mirror portion is bonded to the third, fourth and fifth supporting members by anode junction.

18. A light deflector according to claim 14, wherein the mirror portion has an elliptical shape, and the third supporting member and the fourth supporting member are arranged in a major axis direction of the elliptical shape.

* * * * *